United States Patent [19]

Jaeger

[11] Patent Number: 4,591,052
[45] Date of Patent: May 27, 1986

[54] SMALL COMPONENT STORAGE APPARATUS

[75] Inventor: Gerard Jaeger, Colmar, France

[73] Assignee: ITT Industries, Inc., New York, N.Y.

[21] Appl. No.: 763,948

[22] Filed: Aug. 8, 1985

Related U.S. Application Data

[63] Continuation of Ser. No. 549,236, Nov. 4, 1983, abandoned.

[30] Foreign Application Priority Data

Nov. 9, 1982 [FR] France ............................ 82 18780

[51] Int. Cl.⁴ .......................................... B65D 73/02
[52] U.S. Cl. ................................ 206/328; 206/408
[58] Field of Search ............... 206/389, 443, 328, 408; 242/159

[56] References Cited

U.S. PATENT DOCUMENTS

| | | | |
|---|---|---|---|
| 312,103 | 2/1885 | Euston et al. | 206/389 |
| 1,929,599 | 10/1933 | Millholland | 206/389 |
| 2,853,278 | 9/1958 | Hesler | 206/389 |
| 4,161,248 | 7/1979 | Kacmanovitch | 206/389 |
| 4,291,803 | 9/1981 | Perales | 206/443 |

Primary Examiner—Joseph Man-Fu Moy
Attorney, Agent, or Firm—Donald J. Lenkszus

[57] ABSTRACT

A storage unit for small components such as diodes or tantalum capacitors or the like as described. The storage unit is particularly suited for temporary storage of components between manufacturing steps and for storage from the factory to the user of the components. The unit comprises mainly of a coiled tubular body in which the components slide.

1 Claim, 1 Drawing Figure

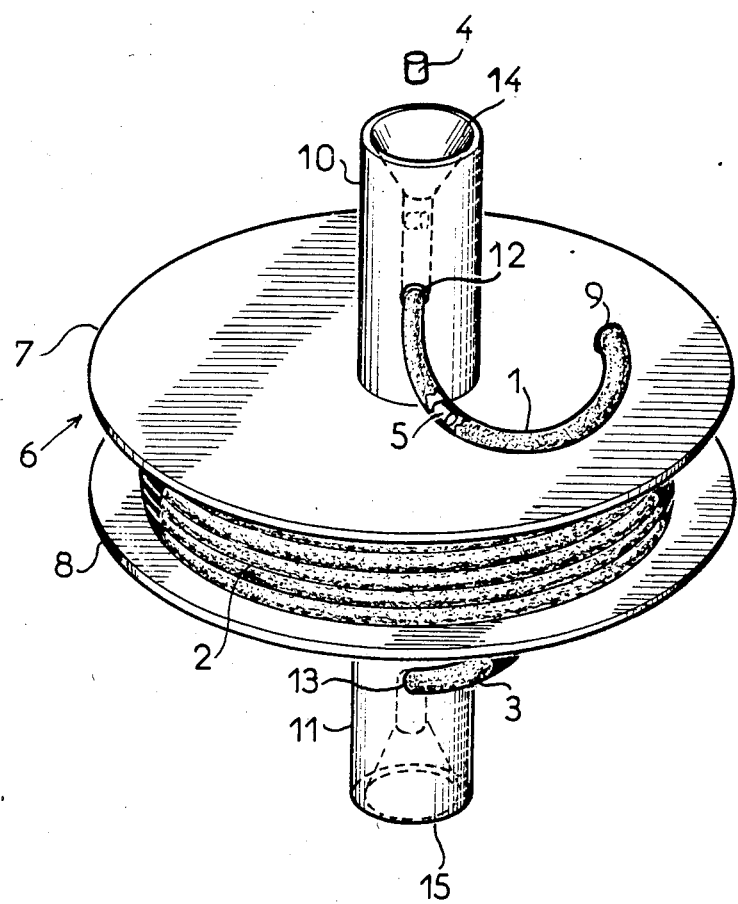

SMALL COMPONENT STORAGE APPARATUS

This is a continuation of application Ser. No. 549,236, filed on Nov. 4, 1983 now abandoned.

BACKGROUND OF THE INVENTION

The present invention concerns the storage of small components, and in particular a storage unit intended to store a large number of components and to provide them all according to the same orientation.

The invention is particularly suitable for the storage of diodes of the kind whole electrodes are metal surfaces designed for direct soldering to a printed circuit board. These diodes consist of an insulating cylinder containing the semi-conductor crystal, terminated by two metal surfaces behaving as electrodes. A cylinder of this type is first of all bonded to a printed circuit board, then, by wave soldering, solidly attached to the board and connected to the circuit. Dimensions of such diodes are, for example, of the order of 3 mm in length and 1.5 mm diameter.

Throughout the various production, delivery and utilization stages of such components, component batches currently comprise thousands of components. These may be bulk stored, but, when required for use, it is necessary not only to align the cylinders, but also to test the conduction direction of the diodes, and turn over those whose conduction direction is incorrect. A supply device accomplishing these operations is excessively costly.

Therefore, it has been considered to provide these diodes in storage units, the most general model of which is a strip, perforated or not, into which the diodes are incorporated so that all follow a definite orientation. For example, the diodes can be crimped onto or encapsulated in the tape. Although this solution offers the advantage of avoiding the need of the expensive supply device mentioned above, cost is still high, and all the more so since the tape is not reusable. In fact, in addition to the cost of the tape, which is relatively high, insertion of the diodes in the tape and extraction prior to use must be provided for. Thus, this method is also excessively expensive for intermediate production storage purposes.

SUMMARY OF THE INVENTION

It is an object of the invention to provide a low cost, reusable storage unit for receiving and providing components in a simple manner, while maintaining their orientation.

According to the main feature of the invention this storage unit comprises a tubular body through which the components slide, and which guides the components so as to maintain their orientation, this tubular body being coiled so that a long length is accommodated in compact form.

According to another feature of the invention, the ends of this tubular body are located onto the axis with respect to which the essential part of the body is coiled, so as, in particular, to enable extraction of the components at a fixed point, while the storage unit pivots about the said axis.

According to another invention feature, said tubular body is coiled on a coil former comprising a cylindrical axial body and two webs, its ends respectively traversing both webs to come along the axis of the coil former.

In an embodiment intended for storage of diodes, as described above, the tube has a circular inside section, sufficiently large to enable the diodes to slide freely, in spite of the bends due to the coiling on the coil former, and those which lead the ends of the tube to the axis of the coil former.

BRIEF DESCRIPTION OF THE DRAWINGS

The invention will be better understood from a reading of the following detailed description, which is given as a non-limitative example, with reference to the appended FIGURE which is a perspective view of a storage unit embodying the present invention.

DETAILED DESCRIPTION

As can be seen on the FIRGURE, the storage unit of this invention basically comprises a round tube, the end of which can be seen at 1, the main coiled part at 2 and the other end at 3.

The diodes, as represented at 4, are cylindrical components, and the diameter of the tube is chosen with respect to that of the diodes so that, in spite of the curves, a diode such as diode 5 slides easily in the tube. Moreover, the material from which the tube is made is chosen so that friction is minimal. In this manner, a diode inserted in the tube with a given axial orientation will maintain this orientation by sliding from one end of the tube to the other. It is understood, of course, that the tube material must not cause the diodes to deposit metal, not to accumulate electrostatic charges liable to lead to their destruction. Also, this material must be sufficiently flexible to take on the configuration shown, and also be sufficeintly rigid to prevent excessive flattening of the inside cross-section.

In practice, these requirements are satisfied by the use of plastic tubing which may be metallized, such as polyvinyl chloride, but other plastic materials may be used. The use of a transparent material offers the additional advantage of enabling a visual check of the tube filling.

To accommodate a long length of tube, the invention provides that it can be coiled on a coil former 6, in one or several layers. This coil former 6 comprises two disk-shaped webs 7 and 8 and a cylindrical body, which is not visible; these three parts are aligned along the same axis. Both webs are provided with openings such as 9, through which one end of the tube runs, rendering it accessible from outside the coil former.

The coil former is further completed by a shaft coupled to the coil former, and laid along its axis. In the disclosed example, this shaft consists of two identical cylindrical shaped half-shafts 10 and 11, each located at the center of each web of the coil former. Each shaft comprises an opening 12, 13, through which the ends 1 and 3 of the storage tube are inserted. Internally, this opening extends into a conduit terminating by a flair 14 and 15, centered along the axis of the coil former. Both flairs can be used as a support for the coil former between two points, as guides to the diodes, at their entry into the tube, and as centering devices to the tube with respect to a diode feeder or withdrawal conduit.

However, if the coil former is of sufficient thickness, the shaft can be included in the coil former body.

A cap, which is not shown, fills the half-shaft flair and is used to obstruct the orifice of each end of the tube and to prevent the diodes from leaving the tube.

For bending radius reasons, the end of the tube leaving one web of the former can also lead not to the flaired orifice of the adjacent half-sheet, but to the other orifice, by traversing the coil former body.

In addition, it will be noted that a coil former is not required in all cases; a coil can be constituted by a tube, the turns of which are bonded together.

Finally, it should be noted that the type of storage unit which has just been described as intended to accommodate diodes, can also be used to accommodate components of a different type, if dimensionally adapted and if a tube of adequate inside cross-section is used. This storage unit can be produced economically, since it consists of a few moulded parts, and offers the advantage of being reusable several times, enabling it to be used not only for the storage of components to be delivered to user customers, but also in works, for intermediate storage of components and transportation between two production stages.

The storage unit described above can easily be filled by gravity by holding the former in an inclined position and rotating it slowly, according to the principle of the Archimedes screw. With more rapid rotation, the centrifugal force enables easier and more complete filling. Different methods may also be used to further improve component loading and unloading, such as vibrations, compressed air, etc.

What is claimed is:

1. A component storage unit for small size components comprising:
   a tubular body for containing a plurality of said components in a predetermined orientation in which said components slide, said tubular body being coiled around an axis;
   a coil former supporting said coiled tubular body, said tubular body including first and second end portions extending through a wall of said coil former and each running along and maintained in position on said axis, said coil former including a cylindrical body, a first web on said cylindrical body supporting said first end of said coiled tubular body, and a second web on said cylindrical body supporting said second end of said coiled tubular body;
   a shaft coupled to said coil former for support and rotation thereof, said shaft including a bore on one end in communication with said first end portion, and a bore on its other end in communication with said second end portion, each of said bores communicating inside said shaft with a conduit having a flair at the end of said shaft, said flairs serving as support for the coil former between two points and guides for the loading and unloading of said components to and from said storage unit.

* * * * *